US010243724B2

(12) United States Patent
Grambichler et al.

(10) Patent No.: US 10,243,724 B2
(45) Date of Patent: Mar. 26, 2019

(54) SENSOR SUBASSEMBLY AND METHOD FOR SENDING A DATA SIGNAL

(71) Applicant: Infineon Technologies AG, Neubiberg (DE)

(72) Inventors: Klaus Grambichler, Velden am Woerthersee (AT); Simon Hainz, Villach (AT); Catalina-Petruta Juglan, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/457,014

(22) Filed: Mar. 13, 2017

(65) Prior Publication Data
US 2017/0195754 A1   Jul. 6, 2017

Related U.S. Application Data

(63) Continuation-in-part of application No. 14/619,314, filed on Feb. 11, 2015, now Pat. No. 9,680,635.

(30) Foreign Application Priority Data

Feb. 12, 2014 (DE) .................. 10 2014 101 754

(51) Int. Cl.
*H04L 7/00* (2006.01)
*H04Q 9/00* (2006.01)
*H04L 12/927* (2013.01)

(52) U.S. Cl.
CPC .......... *H04L 7/0091* (2013.01); *H04L 47/801* (2013.01); *H04Q 9/00* (2013.01); *H04Q 2209/82* (2013.01)

(58) Field of Classification Search
None
See application file for complete search history.

(56) References Cited

U.S. PATENT DOCUMENTS 3,986,162 A * 10/1976 Cholez .................. G01V 1/22
                                                340/870.14
4,516,213 A *  5/1985 Gidden ................ G01R 21/007
                                                324/103 R
(Continued)

FOREIGN PATENT DOCUMENTS

JP          S5525182 A1     2/1980
JP          2002067846 A    3/2002
(Continued)

OTHER PUBLICATIONS

Notice of Allowance dated Feb. 14, 2017 for U.S. Appl. No. 14/619,314.
(Continued)

Primary Examiner — Curtis J King
(74) Attorney, Agent, or Firm — Eschweiler & Potashnik, LLC

(57) ABSTRACT

A sensor device includes a memory circuit and a transmission circuit. The transmission circuit sends a first data signal to an external receiver in a first state of a read-out-mode of the sensor device, if an oscillation period of the oscillating quantity is longer than a period threshold. Further, the transmission circuit sends a second data signal to the external receiver in a second state of the read-out-mode, if the oscillation period of the oscillating quantity is shorter than the period threshold. The second data signal contains information on at least one of a first local extremum sensor data value and a succeeding second local extremum sensor data value.

20 Claims, 8 Drawing Sheets

(56) References Cited

U.S. PATENT DOCUMENTS

| | | | |
|---|---|---|---|
| 4,598,363 A | | 7/1986 | Clark et al. |
| 4,652,876 A | * | 3/1987 | Darilek .................. E21B 34/16 |
| | | | 340/854.9 |
| 4,695,840 A | * | 9/1987 | Darilek .................. G08C 19/22 |
| | | | 340/10.33 |
| 4,831,563 A | * | 5/1989 | Ando ..................... G01C 17/38 |
| | | | 33/356 |
| 5,363,405 A | | 11/1994 | Hormel |
| 5,767,793 A | * | 6/1998 | Agravante ............. G01S 7/032 |
| | | | 180/167 |
| 5,799,069 A | | 8/1998 | Weston et al. |
| 6,303,917 B1 | * | 10/2001 | Hawryluk ................ G01J 1/32 |
| | | | 250/205 |
| 6,895,059 B2 | | 5/2005 | Rogerson et al. |
| 7,409,012 B2 | | 8/2008 | Martin et al. |
| 7,561,035 B2 | * | 7/2009 | Sahashi ................ B60C 23/041 |
| | | | 340/442 |
| 7,612,665 B2 | * | 11/2009 | Okada ..................... F16C 19/52 |
| | | | 340/442 |
| 7,688,216 B2 | * | 3/2010 | Mizutani ................ G01P 3/443 |
| | | | 340/442 |
| 8,140,213 B2 | * | 3/2012 | Boss ....................... G07C 5/008 |
| | | | 340/439 |
| 8,183,982 B2 | | 5/2012 | Scherr |
| 8,542,550 B2 | | 9/2013 | Kim et al. |
| 8,577,634 B2 | | 11/2013 | Donovan et al. |
| 8,935,022 B2 | | 1/2015 | Cooper et al. |
| 8,942,313 B2 | | 1/2015 | Khlat et al. |
| 9,007,951 B2 | | 4/2015 | Reidl et al. |
| 2002/0027347 A1 | | 3/2002 | Fujita |
| 2003/0016762 A1 | | 1/2003 | Martin et al. |
| 2003/0030565 A1 | * | 2/2003 | Sakatani ................ G01H 1/003 |
| | | | 340/679 |
| 2004/0122490 A1 | | 6/2004 | Reinke et al. |
| 2005/0219045 A1 | * | 10/2005 | Ito ........................ G08B 29/145 |
| | | | 340/506 |
| 2006/0232468 A1 | | 10/2006 | Parker et al. |
| 2007/0175268 A1 | | 8/2007 | Honda |
| 2007/0206701 A1 | | 9/2007 | Paley et al. |
| 2008/0048825 A1 | * | 2/2008 | Naether ................. G01P 1/122 |
| | | | 340/5.3 |
| 2008/0088467 A1 | * | 4/2008 | Al-Ali ................ A61B 5/14551 |
| | | | 340/679 |
| 2008/0164996 A1 | * | 7/2008 | Coronel ................. G01D 21/00 |
| | | | 340/539.1 |
| 2009/0030293 A1 | | 1/2009 | Cooper et al. |
| 2009/0124871 A1 | * | 5/2009 | Arshak .................. A61B 5/064 |
| | | | 600/302 |
| 2010/0289652 A1 | * | 11/2010 | Javey ...................... H04Q 9/00 |
| | | | 340/605 |
| 2012/0020430 A1 | | 1/2012 | Haase et al. |
| 2012/0069579 A1 | | 3/2012 | Rofougaran |
| 2012/0128057 A1 | | 5/2012 | Daecke et al. |
| 2012/0250784 A1 | | 10/2012 | Austerman, III et al. |
| 2012/0263256 A1 | | 10/2012 | Waheed et al. |
| 2013/0207798 A1 | * | 8/2013 | Abichaaya .......... B60C 23/0416 |
| | | | 340/447 |
| 2013/0342355 A1 | * | 12/2013 | Lund ...................... G08C 17/02 |
| | | | 340/870.01 |
| 2014/0211817 A1 | | 7/2014 | Wilson et al. |
| 2014/0336623 A1 | | 11/2014 | Van Rens et al. |
| 2015/0229469 A1 | | 8/2015 | Hainz |
| 2015/0236873 A1 | | 8/2015 | Austermann, III et al. |
| 2016/0017706 A1 | * | 1/2016 | Liu ..................... H04W 52/367 |
| | | | 340/853.2 |
| 2016/0191123 A1 | | 6/2016 | Mukherjee |
| 2017/0303015 A1 | * | 10/2017 | Herges ..................... H04Q 9/00 |
| 2018/0017418 A1 | * | 1/2018 | Deak ...................... G01D 18/00 |
| 2018/0068551 A1 | * | 3/2018 | Chi ...................... G08B 21/182 |

FOREIGN PATENT DOCUMENTS

| | | |
|---|---|---|
| JP | 2006250663 A | 9/2006 |
| JP | 2006-309407 | 11/2006 |
| JP | 2007-078626 | 3/2007 |
| JP | 2007198305 A1 | 8/2007 |
| JP | 2010020504 A | 1/2010 |
| JP | 2012114908 A | 6/2012 |
| WO | 2006029592 A1 | 3/2006 |
| WO | 2013/061272 A1 | 5/2013 |
| WO | 2016082933 A1 | 6/2016 |

OTHER PUBLICATIONS

Final Office Action dated Sep. 23, 2016 for U.S. Appl. No. 14/619,314.
Non-Final Office Action dated Mar. 18, 2016 for U.S. Appl. No. 14/619,314.

* cited by examiner

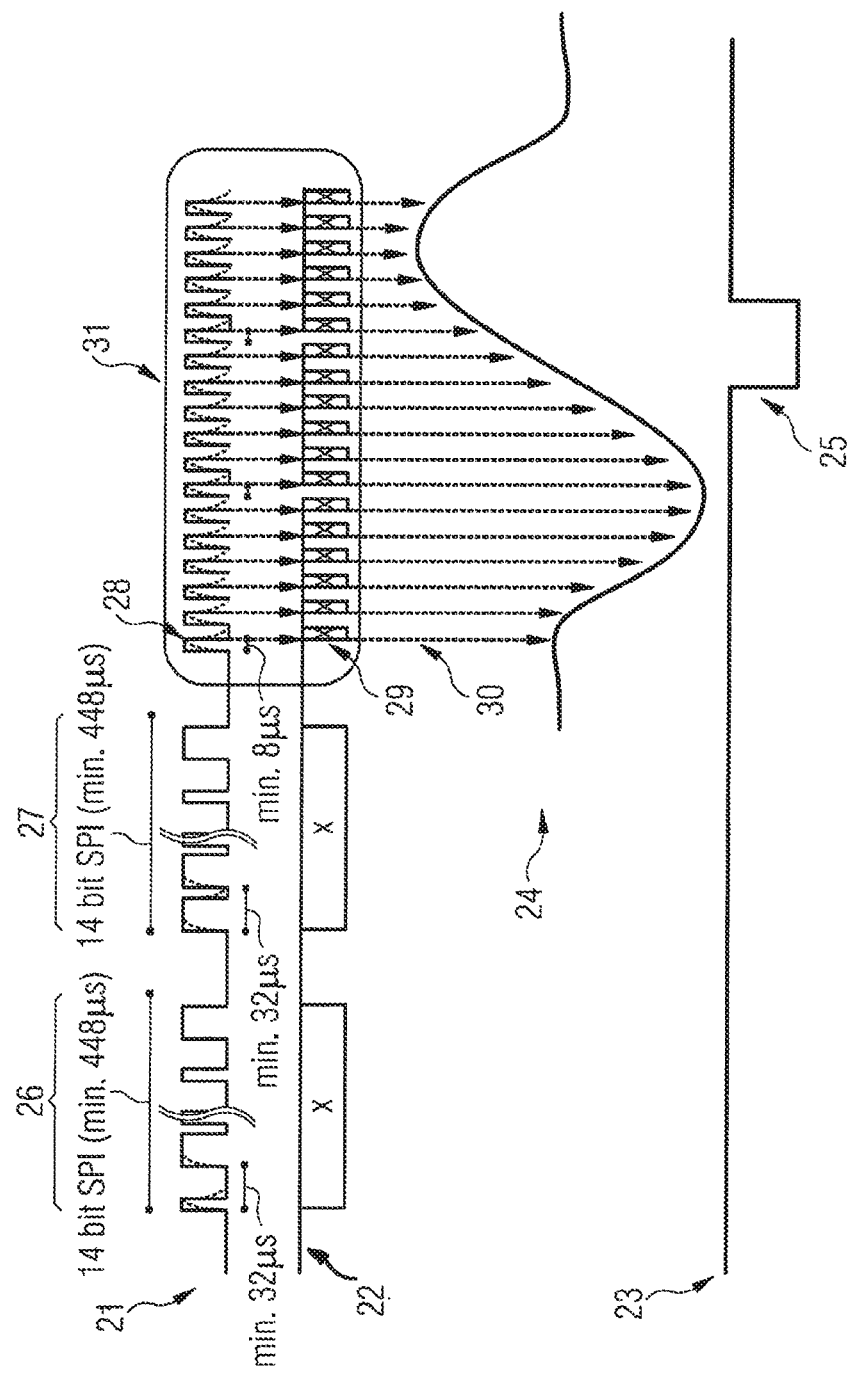

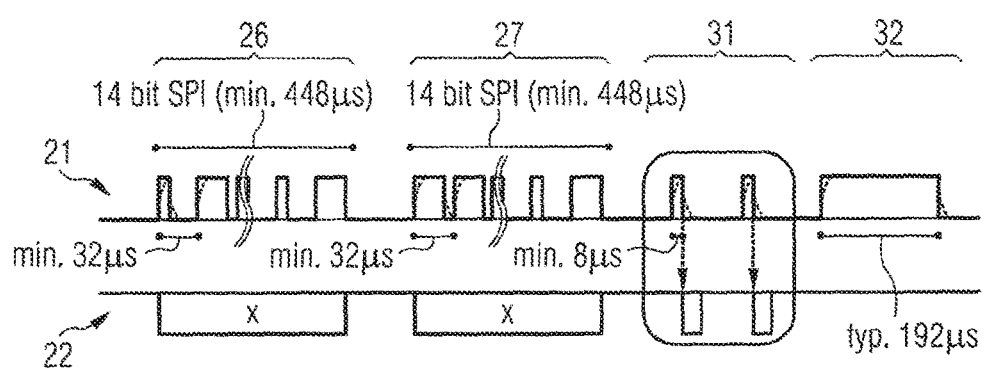

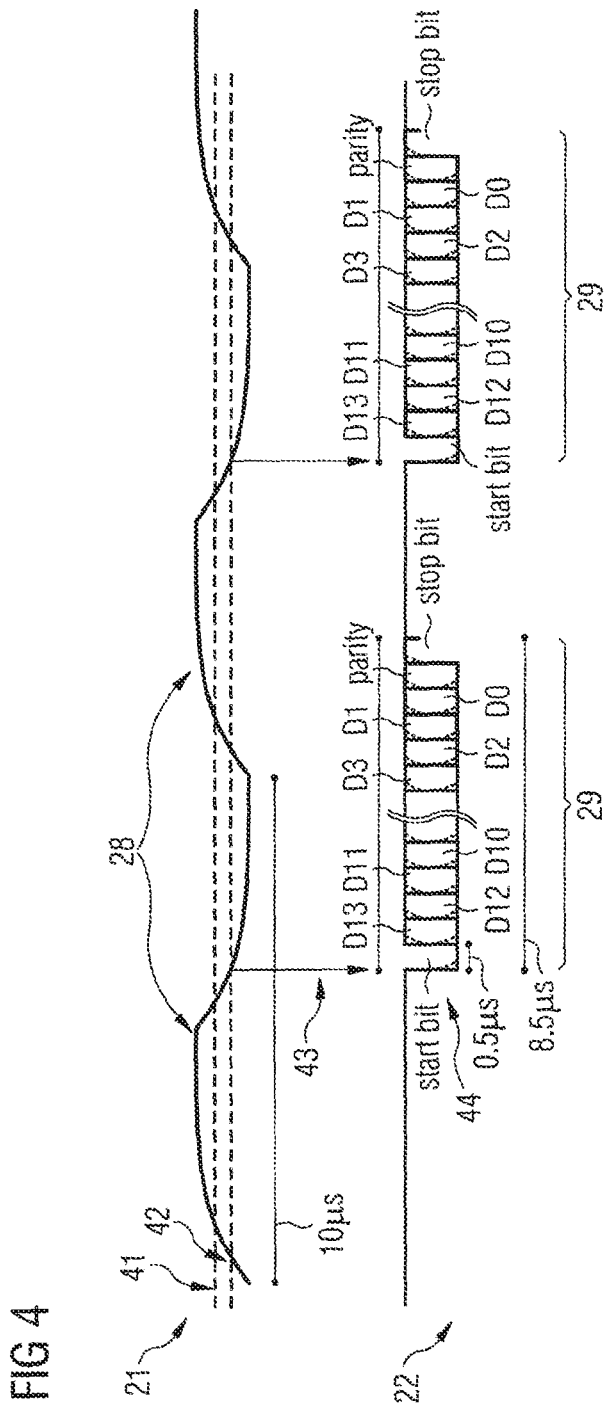

SENSOR SUBASSEMBLY AND METHOD FOR SENDING A DATA SIGNAL

REFERENCE TO RELATED APPLICATION

This application is a continuation-in-part of U.S. application Ser. No. 14/619,314 filed on Feb. 11, 2015, which claims priority to German Application number 10 2014 101 754.4 filed on Feb. 12, 2014, the contents of which are incorporated by reference in their entirety.

FIELD

Example embodiments relate to the field of sensor systems and particularly to sensor devices and methods for data transmission for a sensor device.

BACKGROUND

Sensors require measured values to be transmitted reliably for further processing. In this context, it is desirable for the sensor signals and the measurement results not to be corrupted by the transmission and for transmission to be possible at a speed that makes a change in the measured values comprehensible.

There is therefore a need for sensor signals or measured values to be able to be transmitted quickly and without corruption when needed.

SUMMARY

Some embodiments relate to a sensor device comprising a memory circuit configured to store sensor data values of the sensor device. Each sensor data value represents a measured value of an oscillating quantity. Further, the sensor device comprises a transmission circuit configured to send a first data signal to an external receiver in a first state of a read-out-mode of the sensor device, if an oscillation period of the oscillating quantity is longer than a period threshold. The first data signal contains at least information on a current sensor data value representing a measured value of the oscillating quantity measured between a last preceding measured local maximum value of the oscillating quantity and a next succeeding local minimum value of the oscillating quantity. Further, the transmission circuit is configured to send a second data signal to the external receiver in a second state of the read-out-mode, if the oscillation period of the oscillating quantity is shorter than the period threshold. The second data signal contains information on at least one of a first local extremum sensor data value and a succeeding second local extremum sensor data value.

Some embodiments relate to a sensor device comprising a memory circuit configured to store sensor data values of the sensor device. Each sensor data value represents a measured value of an oscillating quantity. Further, the sensor device comprises a transmission circuit configured to send a sensor signal in a normal operating mode of the sensor device. The sensor signal comprises a pulse for every period of the oscillating quantity. Further, the transmission circuit is configured to send a data signal in a read-out-mode of the sensor device. The data signal contains information on at least one of an offset of sensor data values of the sensor device, a temperature of the sensor device, a stored maximum sensor data value, a stored minimum sensor data value, and data stored by a read-only-memory of the sensor device.

Some embodiments relate to a method for data transmission for a sensor device, comprising storing sensor data values of the sensor device. Each sensor data value represents a measured value of an oscillating quantity. Further the method comprises sending a first data signal to an external receiver in a first state of a read-out-mode of the sensor device, if an oscillation period of the oscillating quantity is longer than a period threshold. The first data signal contains at least information on a current sensor data value representing a measured value of the oscillating quantity measured between a last preceding measured local maximum value of the oscillating quantity and a next succeeding local minimum value of the oscillating quantity. Further, the method comprises sending a second data signal to the external receiver in a second state of the read-out-mode, if the oscillation period of the oscillating quantity is shorter than the period threshold. The second data signal contains information on at least one of a first local extremum sensor data value and a succeeding second local extremum sensor data value.

Some embodiments relate to a method for data transmission for a sensor device, comprising storing sensor data values of the sensor device. Each sensor data value represents a measured value of an oscillating quantity. Further the method comprises sending a sensor signal in a normal operating mode of the sensor device. The sensor signal comprises a pulse for every period of the oscillating quantity. Further, the method comprises sending a data signal in a read-out-mode of the sensor device. The data signal contains information on at least one of an offset of a sensor data value of the sensor device, a temperature of the sensor device, a stored maximum sensor data value, a stored minimum sensor data value, and data stored by a read-only-memory of the sensor device.

BRIEF DESCRIPTION OF THE DRAWINGS

Example embodiments are explained in more detail below with reference to the appended figures, in which:

FIG. 2 shows an electrical signal profile for the fast readout mode;

FIG. 3 shows an electrical signal profile with beginning and end information; and FIG. 4 shows an electrical signal profile for a read out command with data signal transmission.

DETAILED DESCRIPTION

In the following description of the appended figures showing example embodiments, the same reference symbols denote the same or comparable components. In addition, synoptic reference symbols are used for components and objects that occur repeatedly in an example embodiment or in a drawing but that are described together in respect of one or more features. Components or objects that are described using the same or synoptic reference symbols may be of the same design, but possibly also of different design, in respect of single, a plurality of or all features, for example their dimensions, unless the description explicitly or implicitly reveals otherwise.

Example embodiments are explained in more detail below.

Figure 1A:
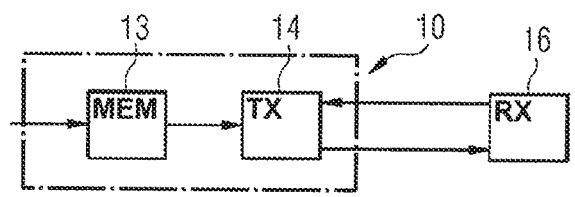
FIG. 1A shows a design of a sensor component with an external receiver.

FIG. 1A shows an example embodiment of a sensor subassembly 10 (sensor device) having the features of a memory unit (MEM) 13 for storing a sensor data value (e.g. measured value of a measured variable measured by the sensor subassembly 10 or other sensor information, such as sensor state or sensor identification) from the sensor subassembly 10 and a transmission (TX) unit 14 for sending a data signal with information about the stored sensor data value to an external receiver (RX) 16 at a data rate that is dependent on a clock frequency of a clock signal produced by the sensor subassembly 10. The transmission unit 14 sends the data signal with the information about the stored sensor data value (sensor data information) on the basis of a piece of trigger information in an externally received control signal.

Subsequently, the sensor data value is described as a measured value of a measured variable measured by the sensor subassembly 10, even though the sensor data value may also be other sensor-internal data.

By way of example, a sensor may be a technical subassembly that can determine/measure physical or chemical ambient conditions and can qualitatively sense or quantitatively measure said ambient conditions. The physical/chemical variables can be sensed and converted into electrical signals that correspond to their quantitative measured variable and that form a measured value and are referred to as a sensor signal, for example.

A subassembly (sensor subassembly or sensor device) may be a single part of a technical complex, for example. A function of said complex may be sensing an ambient condition using sensors, for example. The sensor subassembly may also include a further processing unit, particularly a transmission unit, that can deliver the measured value, e.g. in the form of a data signal. The sensor subassembly may be of discrete design with various components that are manufactured separately from one another and connected or else integrated, for example as a monolithically manufactured circuit. The sensor subassembly may also contain further functionalities, such as further processing of the sensor data, e.g. to provide the data signal in more suitable fashion, or a memory unit in order to buffer-store measured values.

A memory unit 13 (memory circuit) can be used to (buffer-)store data, for example, in order to bridge a time delay between the availability of the data, that is to say the instance of storage, and reading out. By way of example, an analog measurement signal can be converted into a digital measured value and stored digitally by the memory unit 13. Otherwise, the unit for which the data is intended has to fetch the data at the precise moment at which they are available. In the case of the sensor, a measured value that the sensor delivers can be stored. The memory unit 13 can also store a plurality of measured values that are measured simultaneously or chronologically. The storage itself can take place in different registers or memory cells, for example.

The transmission unit 14 (transmission circuit) can be used to transmit data to the receiver 16. By way of example, the transmission unit 14 may also be a transceiver unit in order to send the data signal and to receive a control signal.

By way of example, the transmission unit 14 can send the digitally stored measured value to the receiver 16 by means of digital modulation (e.g. current or voltage from the supply or via a dedicated connection). By way of example, it is possible for digital modulation of the current or of an open sink connection (open drain) to be effected without an external clock in order to send the data signal with the information of the digitally stored measured value. Alternatively, it is also possible for analog transmission by an analog data signal to be implemented for the transmission of the digitally stored measured value.

The receiver 16 may be a unit/device/subassembly that uses the data for a particular purpose. For the transmission of signals, analog or digital methods are appropriate. In digital transmission engineering, for example, it is possible to use a particular protocol that defines how the data are transmitted, so that the transmitter and the receiver understand one another.

By way of example, the memory unit 13 and the transmission unit 14 may be implemented on different semiconductor substrates in a shared housing or on a shared printed circuit board or integrated on the same semiconductor substrate.

By way of example, a data signal can contain information about what is known as a data word, which consists of a plurality of bits, for example. A data word may have an arbitrary number of bits. By way of example, for data transmissions (e.g. in the case of sensors), it is possible to use 14 bits of data (or from a range between 4 and 40 bits), for which a respective bit is used for start, stop and parity.

Information about a measured value may be portions of the measured value, the whole measured value itself or an altered, e.g. further processed, measured value, that is to say a value that is based on a measurement.

By way of example, FIG. 1A externally denotes a unit outside the sensor chip or at least the localization of the receiver unit 16. The receiver 16 or else transceiver may be arranged at an arbitrary interval from the sensor subassembly 10 and send the control signal to the sensor subassembly and receive the data signal from the sensor subassembly 10 by wire, for example. Alternatively, the sensor, the transmitter and the receiver unit may also be integrated in one housing, for example. Regardless of the arrangements, it is possible to use a proposed protocol that is used to transmit the data between the transmission unit 14 and the external receiver 16.

By way of example, the data rate denotes the speed at which the individual bits are transmitted/sent. The transmission of a bit can be initiated by a clock signal that is generated by a clock transmitter (e.g. clock) that outputs clock cycles at a particular frequency (clock frequency), for example. Said clock cycles (possibly in the form of electrical impulses) can also appear singularly or at a variable clock frequency.

By way of example, the piece of trigger information is a piece of information that prompts the transmission unit, following reception of said piece of information, to react such that the transmission process for the information about a measured value in the data signal is begun and performed. That is, to say that the piece of trigger information actuates or triggers the transmission unit (prompts it to send the data signal). This piece of trigger information is located in a control signal that is supplied to the sensor subassembly (e.g. the transmission unit) externally. The piece of trigger information may be an analog signal or a digital data signal, the latter characterized as a single bit, for example, or a data word.

By way of example, a system may be formed such that a transmission unit and a receiver communicate with one another at a particular (for example slow) speed in one mode. By way of example, the receiver sends the transmission unit a command to output a new measured value. Inside the sensor, the present measured value is constantly measured and provided to the memory of the memory unit. Following receipt of this command, the currently available measured value is sent to the receiver. This can take place on a bit-by-bit basis, for example, i.e. when a bit of a data signal (e.g. command or piece of trigger information) is transmitted from the receiver to the transmission unit, the transmission unit then sends a bit of its data signal to the receiver in return. The clock can be prescribed by a clock transmitter, which is generated by means of a clock generator, for example, and supplied to the transmission unit externally or come from inside (e.g. from inside the sensor subassembly). Alternatively, the clock can be prescribed by the incoming data signal, for example, and an internal clock can be produced by means of clock recovery.

A new interface can allow substantially faster data transmission. In this case, it is possible to use a clock frequency that the sensor subassembly itself generates in order to output the data. The internal clock frequency may be freewheeling or in sync with an external clock (e.g. clock of the control signal or external clock signal). By way of example, it is possible to change over from one external clock frequency (for example by means of clock recovery from the trigger signals (31)) or else another internal clock frequency. This internal clock frequency may be independent of external influences. Thus, when the trigger signal is received, it is possible to initiate data transmission at the internal clock frequency. Which data are transmitted can be defined on an application-specific basis. By way of example, it is possible for different registers to be read. The commands 27, for example, can be used to select which registers are intended to be read, or it is also possible for a further control signal to be used to select which register is intended to be read. In the case of a sensor subassembly, it is possible to send information about a measured value, for example.

If the receiver receives the transmission in unsynchronized form, for example, because the transmission rate is dependent on the internal clock frequency, the receiver can accept the data signal at an adequate sampling rate. To this end, the receiver can provide a higher clock rate (e.g. 20 MHz) than the internal clock frequency of the sensor module (e.g. 1 MHz or from a range between 100 kHz and 2 MHz or from a range between 2 MHz and 20 MHz). This can be implemented in an FPGA or the like, for example.

The data rate, generated by the internal clock, is higher than a normal data transmission rate based on an external clock, for example. This can allow faster reading of internal signals, such as data signals generated via AD converters, for example. The data rate of the data signal with the sensor data value information (e.g. during the transmission of the sensor data value information) is dependent only on the clock frequency of the clock signal (15) produced by the sensor subassembly, for example, without being dependent on a clock frequency of an external signal.

By way of example, bit-by-bit asynchronous data transmission without a (fast) clock signal from the outside can allow fast data transmission. In this case, it is also possible to avoid secondary effects, for example when the electrical line via which data are sent from the receiver to the transmission unit has a large capacitance applied to it. This can make fast data transmission more difficult, since the impulses can then be rounded (low-pass filtering, see (28)). This may adversely affect the edge gradient, and hence the maximum succession of impulses and hence the pulse frequency. This may be the case with a backend serial protocol interface (BE-SPI), for example, which prompts signals to be modulated by means of the supply voltage. An energy store using a large capacitance (e.g. 220 nF or from a range between 10 nF and 500 nF or else from a range between 0.5 µF and 10 µF) may be implemented in order to bridge brief voltage interruptions, for example.

By way of example, this can be avoided if the data transmission takes place asynchronously and the transmission unit sends the bits independently at the speed of its internal clock signal, which is generated with an adequate edge gradient. The trigger information that initiates the sending of a data signal can be received per data signal rather than per bit, for example. This can allow a higher data transmission rate in a transmission direction (transmission unit to receiver) than in the opposite direction (receiver to transmission unit), for example. This fast data transmission can also be referred to as fast readout mode in the present case. By way of example, the piece of trigger information comprises an impulse, and the falling (or rising) edge thereof prompts the transmission unit to begin sending the data signal, for example.

In some embodiments, the sensor subassembly is configured to receive a multiplicity of pieces of trigger information, wherein a frequency of this reception of the pieces of trigger information is lower than the data rate or clock frequency at which the individual bits are sent.

It is possible for the cited steps to be repeated several times, i.e. following sending of a piece of trigger information (by the receiver) and reception of the data signal (from the transmission unit) to continue with further sending of a further piece of trigger information, etc. By way of example, the data transmission can be implemented such that the subsequent piece of trigger information is not sent before the data transmission has been terminated. To this end, the frequency at which pieces of trigger information are received (by the transmission unit) may be lower than the data rate at which the bits are sent from the transmission unit to the receiver. Specifically, this may be such that, by way of example, the frequency of the pieces of trigger information is lower than the number of transmitted bits per data signal multiplied by the clock frequency. In that case, the data signals (data words) can be sent completely, for example.

Alternatively, it is also possible for the frequency of the pieces of trigger information to be chosen to be higher. In that case, by way of example, it would no longer be possible for the data words to be transmitted completely, which may suffice in some instances of application.

The recurrent reception of pieces of trigger information and sending of information about measured values by the data signal allows the provision of a fast flow of up-to-date measured values (or information about such values), for example.

By way of example, FIG. 1A shows a sensor subassembly 10 that can be used to store measured values in a memory unit 13. On the basis of control signals from the external receiver 16 that arrive at the transmission unit 14, the transmission unit decides when and which data signals and information are routed to the external receiver.

Figure 1B:
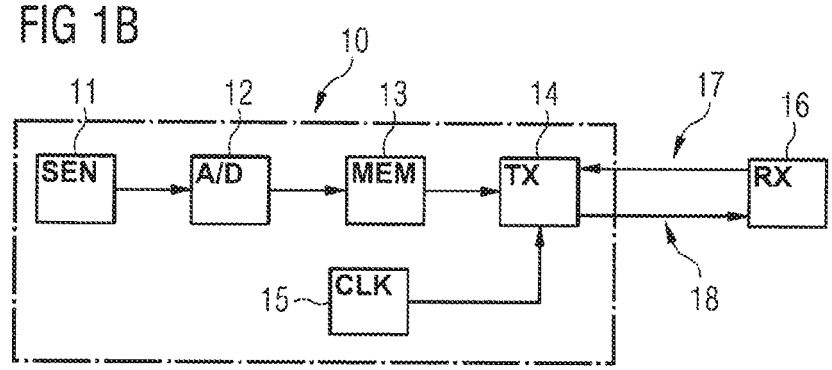
FIG. 1B shows a design of a sensor component with an external receiver and an AD converter.

FIG. 1B shows a sensor subassembly 10 that contains a sensor element 11 that delivers sensor data to an analog-to-digital converter (A/D) 12, which stores the digitally converted measured values in the memory unit 13. On the basis of control signals from an external receiver 16 that arrive at the transmission unit 14 via a channel 17, the transmission unit decides when and which data signals and information are routed to the external receiver via a channel 18. In this case, the clock generator (CLK) 15 outputs an internal clock that the transmission unit can use to send the data signals. The two channels are logical channels and can be physically combined from one channel, for example by modulation of the supply voltage as a channel to form the receiver to the transmission unit and modulation of the supply current or a channel from the transmission unit to the receiver on the same line.

Additionally or optionally, the sensor subassembly may also have one or more details that correspond to one or more of the aforementioned aspects.

The memory unit 13, the analog-to-digital converter 12, the sensor element 11, the clock generator 15 and the transmission unit 14 may be implemented on different semiconductor substrates in a shared housing or on a shared printed circuit board or integrated on the same semiconductor substrate, for example.

In some example embodiments, an analog-to-digital converter is designed to convert analog sensor data for the measured variable that is measured, which sensor data are determined by the sensor subassembly, into a digital measured value for storage in the memory unit.

By way of example, the proposed interface makes it possible to avoid routing a sensitive point in the analog signal path to outside the sensor subassembly. This can result in increased noise in the subassembly (e.g. IC). Furthermore, the output drive needs to be powerful, which means considerable surface area involvement. Hence, there is again the problem that the measurement on the additional pin alters the internal signal. The measured value is therefore not very precise.

The digital interface allows better precision (no noise, etc.) to be afforded. The AD converter can isolate the analog (i.e. sensitive) signal path from the outwardly routed output, which is susceptible to interfering influences. In addition, oversampling and interpolation at the receiver allow the real clock rate of the data transmission to be increased even further, for example.

In some example embodiments, the sensor subassembly contains a magnetic sensor that is designed to measure the measured variable.

One possible use is in a sensor that delivers magnetic data or measures a magnetic field. Precise measurement using favorable subassemblies is a challenge that the concept described can extend favorably in terms of scope of functions. A magnetic sensor delivers an impulse, e.g. as a sensor signal, at the zero crossing of an edge of the magnet signal. For some applications, a digitized measured value from which it is possible to derive the present state of the magnetic field may be needed.

When using the technologies of integrated giant magneto resistance (iGMR) and integrated back bias (iBB), for example, it is possible for the shortcoming of signal precision to be intensified further by interfering influences. The behavior of GMR sensors is difficult to model (particularly the parameters: hysteresis, saturation, temperature), and second it is usually not possible for an iBB package to incorporate a conventional magnetic sensor that could be used to measure the magnetic field data.

One application of the example embodiments of the magnetic field sensors is use in vehicle applications, for example. A crankshaft sensor can be realized by means of a GMR or Hall sensor that measures the coverage of the teeth of a gearwheel mounted on the crankshaft at the end of the crankshaft. A tooth gap indicates a reference point (e.g. the 0° position) of the crankshaft. In normal serial mode, the magnetic sensor is intended to deliver an impulse as it covers each tooth.

The measurement of the present rotation speed, or changes of rotation speed, which is able to be used for correct motor functionality (for example for the correct injection instance), for example, may therefore be dependent primarily on the resolution by the number of teeth per crankshaft revolution, but also on the precision of the magnetic field, or the measurement thereof. For the development of motors and rotation speed applications, it is often not enough merely to measure the individual impulses. More precise information about the magnetic field (in highly resolved form) may be necessary. The fitting of an additional sensor for test purposes is barely possible, firstly on account of a lack of installation space and secondly owing to the corruption of the magnetic field in comparison with when the sensor is not in place for test purposes.

In vehicle engineering, for example, there are applications for the measurement of a magnetic field. This is the case with crankshaft sensors, for example, which measure the coverage of the teeth of the sprocket (angle sensor). In many different applications with magnetic speed sensors of this kind, the design of the magnetic circuits is a challenge. By way of example, although it is possible to use FEM (finite element method) simulations to simulate the theoretical field profile, checking by measurement is possible only with difficulty. There is therefore a need for precise determination of the magnetic field in order to be able to measure the present rotation speed as exactly as possible. Particularly for trial and development purposes, very precise presentation of the magnetic field profile is desirable. At the same time, the quality of the sensor signal is intended not to be impaired by interfering influences, which would be produced by the provision of the presentation of the magnetic profile, for example.

The data transmission of a normal sensor is very slow, even when digitized measured values (and not just zero crossing impulses) are transmitted. If a chip with an internal clock of 2 MHz is used, for example, then maximum bit rates of up to 200 kbits/sec. can be achieved. By way of example, the reason for this is that the BE-SPI is an asynchronous interface and involves the sensor being able to synchronize itself to the external data rate (control signals).

This slow data transmission can be used to perform only quasi-static measurements, for example. It is usually not possible to measure the magnetic field of a motor during idling and to measure any speed or rotation speed fluctuations as a result of the brief influences, for example of injection and combustion. Furthermore, this can result in considerable involvement during development in order to turn a motor so slowly (realization using an external drive, etc., for example).

In fast readout mode, the possible transmission rates may be between 0.5 and 2 Mbit/sec. (or between 0.1 and 10 Mbit/sec.), particularly in the region of 1 Mbit/sec., for example. When the ADC signal is transmitted with 8 bits, for example, the inclusive start, stop and parity bit yields a sampling rate of approximately 90 k samples/sec. When a motor is idling at 600 revolutions/minute, this yields a sampling rate of 9000 samples/revolution or 150 samples/pole pair. This sampling rate may be sufficient to be able to reconstruct the magnetic field information. If this sampling rate is still insufficient, it can be increased further by interpolation, for example.

This allows simplified development options and improved design in support. Particularly in crankshaft applications, it is possible not only for the normal switching signal of the sensor (e.g. impulses at the zero crossing of the magnetic field) but also for the shapes of the magnetic signal to be required and used for evaluation.

In some example embodiments, the externally received control signal is modulated on the supply voltage.

Sensors sometimes have special interfaces, such as what is known as a BE-SPI (backend serial protocol interface), integrated that can be used to send data to the sensor (from the receiver to the transmission unit) by modulating the supply voltage (VDD). In this case, there is no need for a dedicated connection (pin) for the data transmission from the receiver to the transmission unit, for example, or the pins for the operating voltage (VDD and GND) that are in place anyway are used.

The control signal and hence also the piece of trigger information can be received at the sensor subassembly by means of this modulated supply voltage and hence the sending of a data word can be triggered in this manner. The piece of trigger information can also allow a fresh synchronization, for example when no synchronization takes place in the asynchronous transmission mode of the transmission unit. The reception of the piece of trigger information provides the transmission unit with a reference instant again (i.e. synchronization), for example.

In some example embodiments, the data signal with information about a measured value is sent by modulating the supply current.

A further disadvantage may be that in a solution with BE-SPI the internal registers are output instead of the pulse protocol. For the application, this means that either the magnetic field can be read or the motor can be operated with the sensor (classic sensor signal). Again, it is not possible for the sensor signal to be read during idling (because the motor can also be operated in the idling state only if the sensor signal is available).

So as not to have to equip the sensor with an additional connection (pin) for outputting the data signal, what is known as a current interface can also be used. In this case, the sensor subassembly can modulate its current requirement (for the supply current) such that it corresponds to the data signal to be transmitted. The receiver can measure the current consumption and is thus provided with the modulated signal. In this case, the system may need to be designed such that the sensor does not change its current requirement such that the modulated signal is subjected to (a high level of) interference, for example.

Particularly in the case of products with an open drain output (e.g. crankshaft applications), a current interface is suitable as an additional output source. The reason is that in that case the data transmission can take place by means of the modulation of the supply current, and an additional pin is not required.

Furthermore, the same pin assignment for other (simpler) sensors allows the hardware interface to be retained, so that other sensors can likewise be fitted to the system if need be without this function. The other connection (open drain) for the sensor signal can be left unaltered by the new functionality, and the previous sensor value can continue to be visible.

In some example embodiments, the transmission unit pays attention to the piece of trigger information only from reception of a piece of beginning information in the externally received control signal, and no longer notices it from reception of a piece of end information.

In some example embodiments, the transmission unit detects the piece of trigger information, and then sends the data signal with the information about the stored measured value, only from reception of a piece of beginning information in the externally received control signal and prior to reception of a piece of end information.

The use of beginning and end information allows mode changeover, e.g. between normal mode and fast readout mode. Thus, in normal mode, the data signals can be sent to the external receiver synchronously or asynchronously at a first data rate. If the receiver sends a control signal with the beginning information, the transmission unit switches to fast readout mode and waits for the receiver to send a piece of trigger information. If it sends this, the transmission unit begins sending the data signal, for example, the bits of the latter being sent as triggered by the internally generated clock signal.

The mode changeover may mean that it is possible for the piece of trigger information just to be able to consist of an impulse, that is to say not to have to contain another bit pattern (data word), as may be required in normal mode, for example. Otherwise, it would not be clear whether an impulse is a piece of trigger information or a bit of a classic data word.

This allows a test mode for customer service or a development mode (for the development of applications) (what is known as design in support).

In some example embodiments, the beginning information consists of a predefined data word.

Depending on the structure of the data that are transmitted to the transmission unit by the receiver, the structure of the beginning information may be similar. Thus, when data words are transmitted, the piece of trigger information may also have a data word with a particularly predefined bit string and be a command.

In some example embodiments, the piece of trigger information is an impulse with a trigger pulse length.

By way of example, the piece of trigger information itself may consist of or be defined from a data word or else just consist of an impulse. The distinction of the piece of trigger information from other data words or impulses can be rendered possible unequivocally, for example when a piece of beginning information has previously been received from the transmission unit. In that case, there may a clear statement that only trigger impulses or a piece of end information can come from the receiver from that instant, for example. These two signals can have a particular analog signal profile or be impulses of different length, for example, so that both can be distinguished from one another. The length of the piece of trigger information is the trigger pulse length.

In some example embodiments, the end information consists of a longer impulse than the trigger pulse length.

In order to distinguish the piece of trigger information from the piece of end information, one particular option is for the length of the piece of end information to be chosen to be longer than that of the piece of trigger information. When the piece of trigger information is sent, swift realtime transmission is desired, for example, and therefore a long trigger impulse would unnecessarily waste time. The piece of end information prompts a switch back to the normal (slow) transmission mode, for example, and in that case the situation is less time-critical, which means that the piece of end information may also be longer.

In order to be able to distinguish between the two, the length of the piece of end information can be chosen to be at least twice as long as that of the piece of trigger information, for example. By way of example, the piece of end information may have a length of 192 μs or be from the range 100-300 μs or from the range 150-250 μs or from the range 170-210 μs or else be up to 10 ms long. By way of example, the piece of trigger information may have a minimum length of 8 μs or from the range 5-10 μs or from the range 20 μs. In such a case, when the trigger impulse on the modulated supply voltage has a length of 192 μs, for example, the sensor can change back to the normal mode (normal serial protocol interface mode) or slow data transmission. The piece of end information may also have a length that is longer than a maximum or average period between two pieces of trigger information.

In some example embodiments, the receiver sends the piece of beginning information or another bit pattern, as a result of which the transmitter changes back to the normal mode (normal serial protocol interface mode) or slow data transmission.

In some example embodiments, a sensor signal is sent on a connection, and the data signal is sent on the connection instead from the instant of sending of the piece of beginning information.

As an alternative to modulation of the supply voltage or current for the data transmission without a separate connection for the data transmission, it is possible for a hybrid mode to be implemented on an existent connection on which the sensor signal is sent. In this case, the data signal can be transmitted from the piece of beginning information, for example, until the piece of end information appears. In this time between beginning and end information, no sensor signal will be sent, for example. From the piece of end information, the normal mode (e.g. on the open drain connection) with sending of the sensor signal on the basis of the output protocol of the sensor (e.g. the impulse at the zero crossing of the magnetic field) can be resumed.

In some example embodiments, a sensor signal is sent on a connection and the data signal is modulated onto the sensor signal from the instant of sending of the piece of beginning information.

Alternatively, a hybrid mode on the same connection can also be implemented by virtue of the data signal being modulated on the sensor signal. As a result, both signals can be transmitted simultaneously.

In some example embodiments, the data signal is output on a connection that is not used for the supply voltage or a sensor signal.

Alternatively, the data transmission can also be performed via an additional connection (e.g. pin). As a result, both the sensor signal (e.g. output switching of the sensor) and the information about the measured value can be read out. By way of example, possible adverse effects as a result of modulation and outlay for circuits for modulation and demodulation can be avoided in this way.

The measured value can be stored in the memory unit in registers. In this case, a measured value may be associated with a register. In the simplest case, a register exists and a measured value can be stored therein.

In some example embodiments, the measured value is stored in at least two registers and, prior to the piece of beginning information, a piece of register information is received that determines a register whose content is sent to the receiver as information about the measured value.

In some example embodiments, there may also be different pieces of beginning information defined that determine the different registers whose content is sent to the receiver as information about the measured value.

Depending on the extent of the measured value data or other technical circumstances, (buffer-)storage can be performed in one or more registers. These registers can also describe internal states of the sensor. When an internal test mode is activated, for example, these registers can be read. The methods described can be used to read said registers. In this case, the data can be output in modulated form by the digital sensor output, for example.

If there are a plurality of registers in place, it is possible for a piece of register information to be sent from the receiver to the transmission unit, for example, that determines which register content is sent to the receiver in subsequent transmissions.

It is thus possible, prior to the sending of the piece of beginning information, for a piece of register information to be sent that determines which register content is sent for the subsequent pieces of trigger information.

By way of example, it is possible for a subassembly-specific readout mode to be defined, for example, in order to read the internal speed and direction registers in fast readout mode. First of all, a read command (piece of register information) can be sent that stipulates which digital register is meant to be read. A second (e.g. serial protocol interface) command can then be used to activate the fast readout mode (piece of beginning information). Once said mode has been activated, the transmission unit of the sensor can deliver the register desired in the last piece of SPI register information for every trigger (piece of trigger information). There would then no longer be a need for a separate command for the piece of register information for every trigger.

In some example embodiments, the measured value is stored in at least two registers and the content of the registers is sent to the receiver in a defined order (e.g. alternately) as information about the measured value.

If a plurality of registers are in place and if all are intended to be read, however, then an alternating mode can be used. The register contents can be sent in order. By way of example, one register per piece of trigger information. Once all have been sent, the process begins at the first register again. By way of example, it is thus possible for various or all portions of the information about the measured value to be transmitted, so that the receiver receives or can produce the complete information about the measured value.

If precisely two registers are in place, it is possible for the least significant bit of a sent data word, for example, to describe which of the two registers has been transmitted in this instance of sending.

Figure 1C:
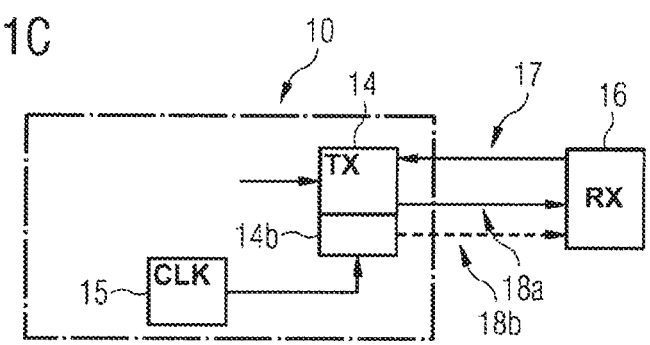
FIG. 1C shows a design of a sensor component with a clock generator and two data rates.

FIG. 1C shows a sensor subassembly 10 having a clock signal generator 15 and a transmission unit 14 that communicates with an external receiver 16. On the basis of control signals 17 from the external receiver that reach the transmission unit 14, the transmission unit routes data signals to the external receiver at a first data rate 18a. If, on the basis of control signals, a second data rate 18b is used, the clock generator 15 prescribes an internal clock in this case. This is done at a relatively high speed (illustrated by shorter dashes), for example.

Some example embodiments relate to a sensor subassembly having the features of a clock signal generator for producing an internal clock signal and of a transmission unit for sending a data signal at a first data rate. The first data rate is less than or equal to a data rate or a frequency of an externally received control signal. The transmission unit sends a data signal at a second data rate, which is dependent on a clock frequency of the internal clock signal, following reception of a piece of trigger information in the externally received control signal. The second data rate is higher than the data rate or the frequency of the externally received control signal.

By way of example, a clock signal generator denotes a module/unit that generates a clock signal. By way of example, this can be realized by an oscillator, a Pierce circuit, phase locked loop, etc.

Unlike in the case of the clock recovery, the clock is generated internally in this case. Said clock may thus be asynchronous with respect to a clock of an external chip.

The first data rate may be the rate of a first transmission mode. This mode may be characterized in that synchronous transmission takes place, for example, i.e. the transmission unit matches itself to a clock or, by means of clock recovery, to the speed of the receiver.

The second data rate may be the rate of a special transmission mode. In this mode, asynchronous transmission can take place, i.e. the transmission unit sends regardless of a clock at the receiver end. In the present case, the clock for the second data rate is produced internally by the sensor subassembly.

On the basis of a piece of trigger information, the subsequent data signal is sent at the second data rate (fast readout mode). By way of example, the transmission unit can change over from serial protocol transmission (e.g. on the basis of a standard protocol, such as the SPI protocol, for example) at the first data rate to faster transmission at the second data rate following reception of the piece of trigger information (28).

The control signal is sent from the receiver to the transmission unit. Said control signal may contain single commands, for example in order to ask the sensor for measurement or for transmission of a data signal. Alternatively, a piece of trigger information prompts the sensor subassembly to send data at the second data rate.

The data signal may contain information about measured values.

In this way, it is thus possible to provide a test mode, for example. This means that, during sensor operation with the first transmission mode, the sensor subassembly can be addressed (by means of the control signals) only such that the first data rate is used for sending. If this piece of trigger information is used to initiate the faster transmission at the second data rate, a more detailed measured value profile (with more measured values per unit time) can be sent by the sensor subassembly.

In some example embodiments, the first data rate is (likewise) dependent on a clock frequency of the internal clock signal.

The first data transmission rate may also be dependent on a clock of an internally generated clock signal. This means that it is not possible to change between synchronous and asynchronous transmission, but rather only to change the speed/frequency. To this end, a single internal clock generator may be provided, for example, that can output more than one frequency using a frequency divider, for example. The clock can then be changed by virtue of the frequency divider being switched on or changed over, for example.

In some example embodiments, the first data rate is dependent on an external clock signal.

A separate signal can be supplied to the transmission unit, which signal describes the clock and governs the transmission unit when sending the bits. In the normal mode (or serial mode of an appliance), synchronous (synchronized by the external clock) transmission can take place. In order to realize a test mode, the sensor can be provided with an opportunity for fast data transmission.

In some example embodiments, the first data rate is dependent on the control signal received.

By way of example, a clock signal can be derived from the control signals. This clock signal may be modulated on the control signal or obtained by means of clock recovery, for example. This makes it possible to avoid keeping an external clock signal on a separate line for a synchronous data transmission, specifically for reasons of cost and miniaturization.

Figure 1D:
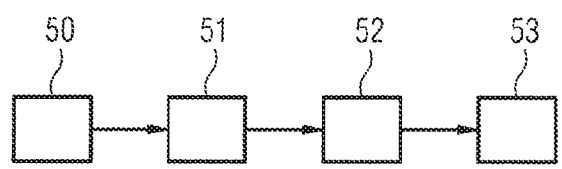
FIG. 1D shows a flowchart for a method for data transmission from a sensor subassembly.

By way of example, FIG. 1D shows a flowchart for a method in which the measured variable is sensed with the sensor element 50, said measured variable is stored 51, is sent 52 and is received by an external receiver 53.

In other words, some example embodiments relate to a method for data transmission from a sensor subassembly comprising storage 51 of a measured value for a measured variable measured by the sensor subassembly (in a memory unit) and sending 52 (from a transmission unit) of a data signal with information about the stored measured value to an external receiver at a data rate that is dependent on a clock frequency of a clock signal produced by the sensor subassembly. The data signal with the information about the stored measured value is sent asynchronously with respect to a clock or a frequency of the control signal on the basis of a piece of trigger information in an externally received control signal.

The method may additionally or optionally also have one or more steps or details that correspond to one or more of the aspects cited previously.

FIG. 2 shows an electrical signal profile in which control signals 26, 27, 28 move from the external receiver 16 via a modulated supply voltage 21 (VDD) to the transmission unit 14. In order to transmit data signals to the receiver, the transmission unit modulates the supply current 22, the level of which can be measured back by the receiver. A connection (e.g. open drain) for transmission of the sensor signal can transmit a signal in accordance with the profile 23, which prompts an impulse 25 to be sent at a zero crossing of the magnetic field 24. The supply voltage is used to send specific control signals, as shown here a read command 26 with a piece of register information and a subsequent fast read out command 27 with a piece of beginning information, so that there is a provision that subsequent control signals are pieces of trigger information 28. In response to each piece of trigger information, the transmission unit sends data signals 29 with information about the measured value to the receiver using the modulated supply current. At each of the trigger instants 30 from the supply voltage 21, it is thus possible for the respective measured value of the magnetic field strength 24 (and/or possibly direction) to be transmitted during fast read out 31. The large number of measured values can be used to reconstruct the signal profile of the magnetic field, for example.

The figure shows a proposed signal profile in which the bits of the control signals are at least 32 µs long, for example, and the control signal itself is therefore 448 µs, while the bits of the trigger impulses are at least 8 µs long and each command (besides trigger information and end information) contains 14 bits of useful data.

FIG. 3 shows a cycle of a fast readout mode, including beginning and end information. The two data channels are again formed by means of voltage and current modulation. Following a read command 26, in which the register to be read is indicated, a subsequent fast read out command 27 is used to change over to the fast readout mode 31 and trigger impulses 28 or a piece of end information 32 is/are awaited. The figure shows the sending of a data signal with information about two measured values in the fast readout mode. The impulse for a piece of end information may be 192 µs, for example.

The signal 21 is shown as modulation of the operating voltage in the example, but it would also be possible to use an additional data line from the receiver to the transmitter. The signal 22 is shown as modulation of the operating current in the example, but it would also be possible to use an additional data line from the transmitter to the receiver.

FIG. 4 shows a detailed signal profile for two pieces of trigger information 28 with associated data signals 29 that are again sent on the two channels 21 and 22. By way of example, the profile shape of the piece of trigger information is rounded by the buffer capacitance of the supply voltage for the sensor subassembly. The shallow edges can be seen. There are a higher threshold value 41 and a lower threshold value 42 for a hysteresis. When the lower threshold value 42 is undershot, the data transmission 44 can be triggered 43.

In some example embodiments, it is also possible to dispense with the hysteresis. The data transmission can also be triggered on the rising edge.

The following coding of the data signals 29 can be used, for example. A start bit (e.g. always 0) is used for synchronizing the data transmission. Data bits are D14 to D0, the most significant bit (MSB) being sent first and the least significant bit (LSB) being sent at the end. If the speed and direction registers have been read in alternating mode, the LSB can indicate which of the two register contents has been sent. A parity bit with even parity about the 14 data bits is included. A stop bit (e.g. always 1) terminates the data transmission. The coding of the bits themselves can be realized using various line codes. By way of example, the Manchester code can be used, which can simplify clock recovery, for example.

For the timing, a minimum interval between the pieces of trigger information of, by way of example, can be implemented. The lower threshold 42 can be significantly undershot by the signal 28, for example, and the upper threshold 41 exceeded, so that the triggers 43 can be reliably identified. Since, for the current modulation, the rounding by the capacitor occurs to a much lower extent, for example, the bits on this channel can follow in faster succession. For this, it is possible to propose 0.5 µs bit length (or from a range between 0.1 µs and 10 µs, for example), or clock frequency, for example, which results in an 8.5 µs length for the whole data signal at 14 bits per word.

Synchronization between transmission unit and receiver takes place only at the instant of the falling edge (or rising edge) of the piece of trigger information 28, for example. The transmission unit can then send at its clock frequency, while the receiver is on its own, when the data signal is received correctly. Should the receiver itself also use a dedicated internal clock transmitter, the frequency can differ as follows, for example: a deviation in the clock of 50% when the stop bit is reached may be admissible. This allows a clock frequency difference of 50%/16=3.125%, for example. 16 is the number of bits without the stop bit, for example. The formula applies for other word lengths accordingly. Hence, the sensor can be trimmed by means of finite elements, for example, while the receiver uses a crystal oscillator without the deviation becoming too great.

The concept described above and the various aspects described for the different example embodiments can also be integrated generally into a transceiver for transmitting data. In other words, some example embodiments relate to a transceiver having a memory unit for storing a data value for the transceiver or a data value provided by another subassembly and having a transmission unit for sending a data signal with information about the data value to an external receiver at a data rate that is dependent on a clock frequency of a clock signal produced by the transceiver. The transmission unit sends the data signal with the information about the data value on the basis of a piece of trigger information in an externally received control signal.

The transceiver may optionally have one or more additional features that have been described in connection with the aforementioned concept or one or more of the aforementioned example embodiments.

Figure 5:
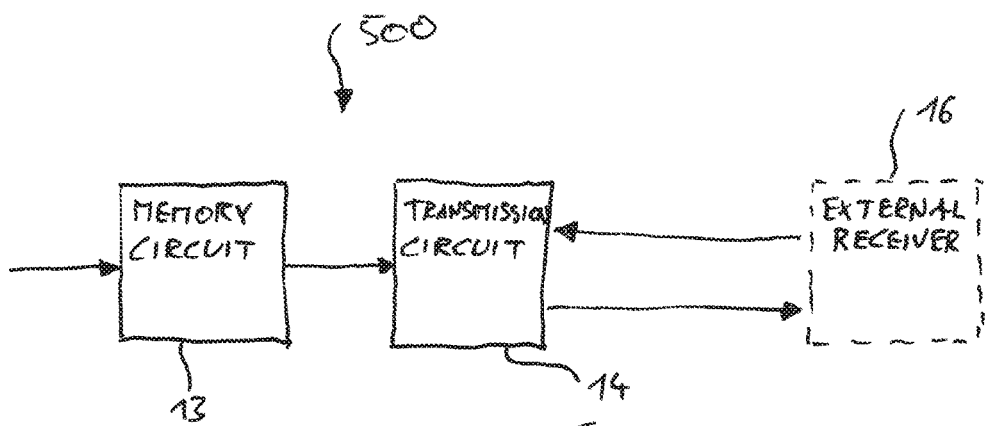
FIG. 5 shows a block diagram of a sensor device.

FIG. 5 shows a block diagram of a sensor device 500 according to an embodiment. The sensor device 500 comprises a memory circuit 13 connected or coupled to a transmission circuit 14 (e.g. transmitter or transceiver). The memory circuit 13 is configured to store sensor data values of the sensor device 500. Each sensor data value represents a measured value of an oscillating quantity (e.g. magnetic field). The transmission circuit 14 is configured to send a first data signal to an external receiver 16 in a first state of a read-out-mode of the sensor device 500, if an oscillation period of the oscillating quantity is longer than a period threshold. The first data signal contains at least information on a current sensor data value representing a measured value of the oscillating quantity measured between a last preceding measured local maximum value of the oscillating quantity and a next succeeding local minimum value of the oscillating quantity. Further, the transmission circuit 14 is configured to send a second data signal to the external receiver in a second state of the read-out-mode, if the oscillation period of the oscillating quantity is shorter than the period threshold. The second data signal contains information on at least one of a first local extremum sensor data value (corresponding to a first measured extreme value of the oscillating quantity) and a succeeding second local extremum sensor data value (corresponding to a succeeding second measured extreme value of the oscillating quantity).

If the oscillation frequency of the oscillating quantity increases, the time may be insufficient for transmitting information on a large number of sensor data values. By reducing the number of transmitted sensor values to maximum and/or minimum values, if the oscillation frequency of the oscillating quantity gets too high, sufficient information of the wave form of the oscillating quantity can be provided to acquire some additional information (e.g. reliability information or error information) at the receiver side.

The first data signal may contain one or more sensor data values representing measured values of the oscillating quantity measured between a last preceding local maximum sensor data value of the oscillating quantity and a next succeeding local minimum sensor data value of the oscillating quantity. For example, the external receiver 16 may transmit trigger pulses and the sensor device may output a current or last sensor data value representing a currently or latest measured value of the oscillating quantity with the first data signal by the transmission circuit 14 in response to every trigger pulse. Depending on the frequency of the received trigger pulses and the frequency of the oscillating quantity one or more sensor data values may be output after a local maximum sensor data value and before a succeeding local minimum sensor data value.

For example, the second data signal may contain information on at least one of a first local extremum sensor data value (corresponding to a first measured extreme value of the oscillating quantity) and a succeeding second local extremum sensor data value (corresponding to a succeeding second measured extreme value of the oscillating quantity)

without containing information on any other sensor data value corresponding to a measured value of the oscillating quantity measured between the first local extremum sensor data value and the second local extremum sensor data value. The second data signal may contain extreme values only. For example, the transmission circuit 14 may transmit in the second state of the read-out-mode solely extreme values of the oscillating quantity. The second data signal may contain information on maximum sensor data values and/or minimum sensor data values. For example, the first local extremum sensor data value corresponds to a latest measured local maximum value of the oscillating quantity and the second local extremum sensor data value corresponds to a latest measured local minimum value of the oscillating quantity. For example, the transmission circuit 14 may output the second data signal containing maximum sensor data values only or minimum sensor data values only or maximum sensor data values and maximum v sensor data values. For example, the transmission circuit 14 may transmit data with the same or substantially same data rate in the first and second state of the read-out-mode. For example, a number of sensor data values transmitted per unit time in the first state of the read-out-mode is equal (or differs by less than 20% or less than 10%) to a number of sensor data values transmitted per unit time in the second state of the read-out-mode. For example, the sensor device 500 may receive trigger pulses with a same frequency in the first state and the second state of the read-out-mode from the external receiver 16.

The memory circuit 13 may comprise a plurality of memory cells. The plurality of memory cells may be assigned to a plurality of registers for storing sensor data values or other data (e.g. status information or temperature). For example, the memory circuit 13 may comprises a measurement register configured to store the current sensor data value, a maximum register configured to store the latest measured local maximum value, and a minimum register configured to store the latest measured local minimum value. For example, the measurement register may be updated every time a new value of the oscillating quantity is measured. Further, the memory circuit 13 may comprise one or more registers for storing an offset of the sensor data values, a current temperature, a reference temperature, a status of the sensor device, and data stored in a read-only-memory of the sensor device 500.

The sensor device 500 may change to the read-out-mode after reset, after power up or from a normal-operating-mode after reception of a read-command (e.g. FIGS. 2 and 3). In the read out mode, the sensor device may output sensor data values or other information (e.g. status information or temperature). A read-command received from the external receiver 16 may indicate one or more registers of the memory circuit to be read out and transmitted to the external receiver 16. For example, the sensor device 500 may change in (the first state or the second state of) the read-out-mode after reception of a sensor-data-value-read-command indicating the measurement register of the memory circuit. For example, the transmission circuit 14 (or a receiver circuit of the sensor device) may be configured to receive the sensor-data-value-read-command from the external receiver and may start transmitting at least one of the first data signal (e.g. if the oscillation period of the oscillating quantity is longer than a period threshold) and the second data signal (e.g. if the oscillation period of the oscillating quantity is shorter than the period threshold) in response to the reception of the sensor-data-value-read-command.

Additionally, the transmission circuit 14 may be configured to receive a fast-read-out-command from the external receiver (e.g. FIGS. 2 and 3) and may start transmitting at least one of the first data signal and the second data signal after reception of the fast-read-out-command.

For example, the transmission circuit 14 may be configured to receive trigger pulses from the external receiver 16 in the e.g. first state and/or second state of the read-out-mode and may send information stored in at least one requested register after a trigger pulse. The information stored in the requested register may be information on the current sensor data value (e.g. raw sensor data values or filtered data sensor values). It is to be understood that such current sensor data value may comprise speed channel information or direction channel information, alike.

Alternatively or additionally the information stored in the register may be at least one of the latest local maximum sensor data value, the latest local minimum sensor data value, an offset of the sensor data values, depending on circumstances the offset may be derived from averaging over several sensor data values (e.g. average sensor data value). Further non-limiting examples of the information stored in the register are a current temperature, a reference temperature (e.g. measured at a previous time or in a specific state), a status of the sensor device, and data stored in a read-only-memory (e.g. EEPROM or laser fuse ROM) of the sensor device.

Figure 6:
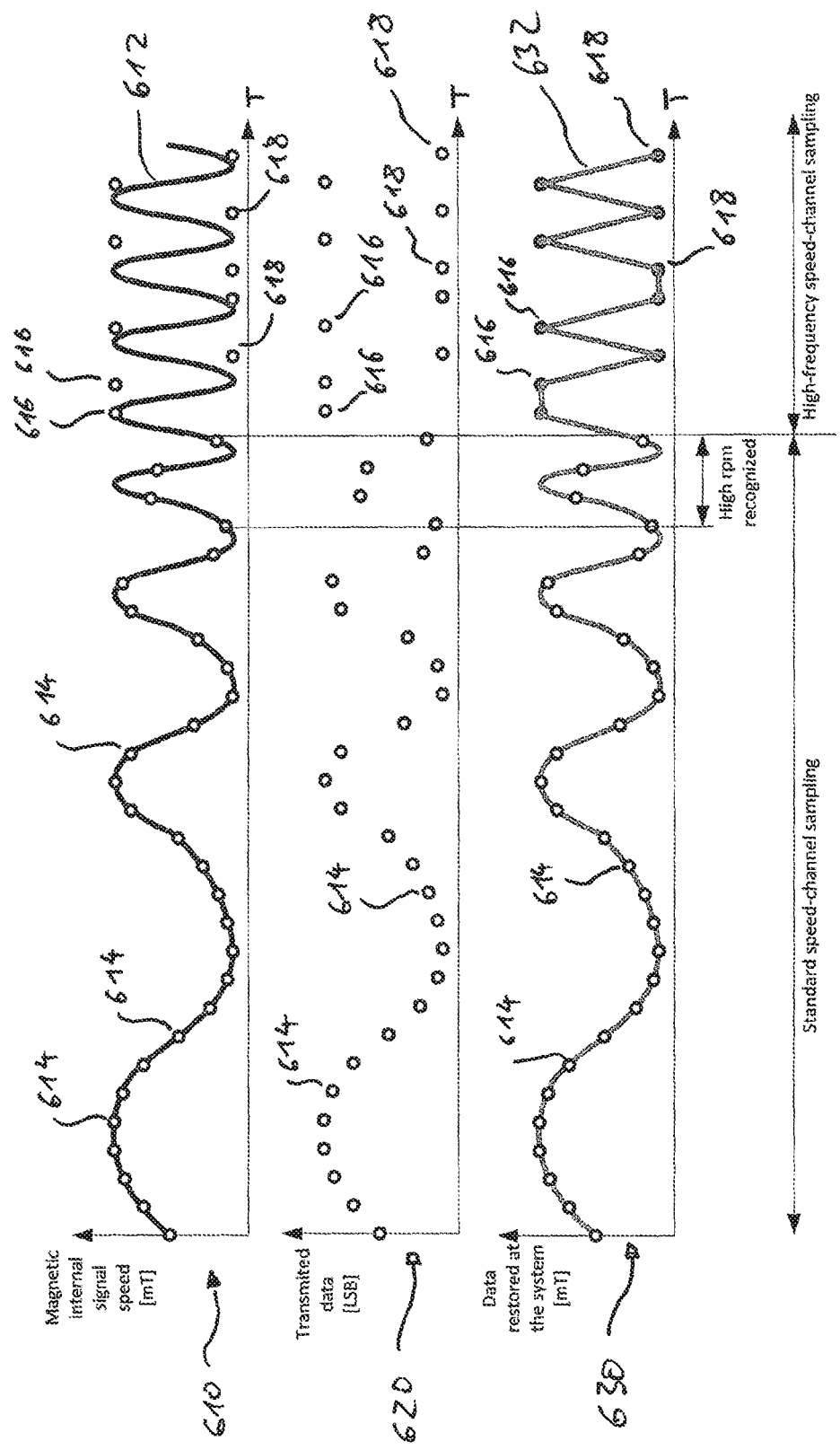
FIG. 6 shows a schematic illustration of sensor data values over time.

For example, the transmission circuit 14 may send the second data signal containing the latest extremum value (e.g. either maximum or minimum) after every trigger pulse received in the second state of the read-out-mode (e.g. FIG. 6).

For example, the requested register of the memory circuit 13 may be identified by address information received from the external receiver 16. For example, the address information may be part of a read-command, a read-out-command, a fast-read-out-command. For example, the sensor-data-value-read-command may indicate a register storing a sensor data value, the latest local maximum sensor data value and/or the latest local minimum sensor data value. For example, the address information may indicate only one register or more than one register (e.g. to be output alternatingly). For example, the read-command, the read-out-command, the fast-read-out-command may be a bit sequence indicating address information (of one or more registers) and/or indicating whether a fast read out mode should be entered for sending the information stored in the one or more requested registers (e.g. and optionally indicating at which speed the information should be sent). The transmission circuit 14 may send repeatedly information stored in the one or more requested registers until end information (e.g. pulse of predefined length, for example, longer than trigger pulses) is received from the external receiver 16.

For example, a latest measured local extremum value may be transmitted repeatedly until a further local extremum value is measured.

It is to be understood that in the second state of the read-out mode, the transmission circuit is configured to transmit the first local extremum sensor data value in response to a first or a second trigger pulse.

In response to the first trigger pulse, the transmission circuit may be configured to send the first local extremum sensor data value corresponding to a most recent measured local extremum value of the oscillating quantity. In response to the second trigger pulse, the transmission circuit may be configured to retransmit the first local extremum sensor data value provided no newer local extremum value of the oscillating quantity was measured since the first trigger pulse.

The period threshold may be a predefined value indicating a length of a period at which the sensor device 500 may switch from the first state to the second state of the read-out-mode. Alternatively, a frequency threshold may be used indicating a frequency at which the sensor device may switch from the first state to the second state of the read-out-mode. The period threshold may be lower than 10 times (or lower than 5 times) a time between directly succeeding trigger pulses received in the first state (or the second state) of the read-out-mode and/or may be larger than 2 times (or larger than 4 times) a time between directly succeeding trigger pulses received in the first state (or the second state) of the read-out-mode. For example, the period threshold may be lower than 80 µs (or lower than 50 µs) and/or larger than 10 µs (or larger than 20 µs).

For example, the sensor device 500 may comprise a control circuit configured to determine a current oscillation period (or current oscillation frequency) of the oscillating quantity. Further, the control circuit may be configured to switch the sensor device from the first state of the read-out-mode to the second state of the read-out-mode, if the current oscillation period falls or drops below the period threshold (or the current oscillation frequency rises above the frequency threshold).

For example, the transmission circuit is configured to send a sensor signal in a normal operating mode of the sensor device. The sensor signal may comprise a pulse for every period of the oscillating quantity (e.g. profile 23 in FIG. 2). For example, the sensor signal may comprise (e.g. a rising or falling edge of) a pulse at every zero crossing, every local maximum or every local minimum of the oscillating quantity.

The sensor device 500 may comprise one or more sensor circuits to measure the oscillating quantity. For example, the sensor device 500 may comprise a speed channel sensor and a direction channel sensor located at different positions in proximity of a rotating element (e.g. gear wheel) causing the oscillating quantity. For example, the oscillating quantity may be a magnetic field caused by the rotating element and the sensor device 500 may comprise at least one magnetic field sensor configured to generate the measured values of the oscillating quantity by measuring the magnetic field.

The memory circuit 13, the transmission circuit 14 and/or other optional units (e.g. control circuit) may be implemented independently from each other or may be realized at least partly together (e.g. on the same semiconductor die). For example, the memory circuit 13 and the transmission circuit 14 may be implemented on a same semiconductor die of the sensor device 500.

The external receiver 16 (or transceiver) may be a device external to the sensor device 500 and coupled or connected (by a wired connection or wirelessly) to the sensor device 500. The external receiver 16 may be an electronic control unit ECU (e.g. board computer of a vehicle) or a transmission control unit TCU or a micro controller or computer. For example, the external receiver 16 may be connected to the sensor device 500 by a wire connection and may provide a supply voltage and/or supply current to the sensor device 500. For example, the external receiver 16 may provide control signals to the sensor device 500 by modulating the supply voltage of the sensor device 500 and/or the transmission circuit 14 of the sensor device 500 may transmit the sensor signal and/or the data signals by modulating the supply current of the sensor device 500.

For example, the sensor device 500 may be a magnetic speed sensor. Magnetic sensors may be applied automotive speed sensors due to their robustness against harsh environmental conditions. Choosing magnetic sensors may nearly eliminate speed measurement impediments, such as friction, light or contaminants. Magnetic speed sensors may use several magnetic principles that can be used by active sensors such as Hall Effect, Anisotropic magneto resistance (AMR) Effect, Giant magneto resistance (GMR) Effect or Tunnel magneto resistance (TMR) Effect. The magnetic sensor may produce a digital output proportional to the magnitude of flux (e.g. not related to the rate of change of flux). For example, crankshaft wheels may have a reference zone to enable the ECU (Engine Control Unit) to detect the zero-position of the engine. For example, the crankshaft wheels have one or two consecutive teeth missing. The sensor may recognize this without influencing other operating parameters. For example, the magnetic speed sensor outputs a sensor signal comprising at least one (or exactly one) pulse for every period of the oscillating magnetic field or a pulse, a falling or raising edge at every zero-crossing (or maximum or minimum) of the magnetic field. For example, the ECU may calculate the speed or an angle of the crankshaft (or another rotating element) based on the sensor signal.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4) or below (e.g. FIG. 6-9).

FIG. 6 shows a schematic illustration of sensor data values over time. The top diagram 610 illustrates a course 612 of a filtered magnetic field (e.g. magnetic internal signal speed in milli-Tesla [mT]). Further, the top diagram 610 illustrates current sensor data values 614 at times of received trigger pulses corresponding to filtered measured values of the magnetic field during the standard speed-channel sampling. During the standard speed-channel sampling, the sensor device may be in the first state of the read-out-mode and may transmit the first data signal as described in connection with FIG. 5. If the oscillation frequency of the magnetic field increases and the period of the oscillation of the magnetic field decreases, high rounds per minute RPM (of the rotating element) may be recognized and after the period of the oscillation of the magnetic field falls below a predetermined period threshold, the sensor device changes to high-frequency speed-channel sampling. During the high-frequency speed-channel sampling, the sensor device may be in the second state of the read-out-mode and may transmit the second data signal as described in connection with FIG. 5. Top diagram 610 illustrates latest maximum sensor data values 616 or minimum sensor data values 616 at times of received trigger pulses. The sensor device may send repeatedly the same extreme value (maximum or minimum) until a next extreme value is measured. For example, this is different to a transmission of alternating min- and max-registers.

The middle diagram 620 indicates sensor data values transmitted to the external receiver (e.g. transmitted data as least significant bits [LSB]). For example, the speed-information can be transmitted as analog values digitized into values of e.g. 14 Bits to the system. The user may be able to follow the magnetic signal. For example, at a certain frequency (e.g. Shannon frequency), the signal cannot be demultiplexed at a sufficient accuracy.

To provide the information of maximum peak and minimum peak which may be essential for diagnosis feature at high rpm, the signal-frequency of the magnetic signal may be measured and put into relation to the trigger-frequency of the system. As soon as the frequency of the magnetic signal reaches e.g. 20% of the trigger frequency the mapping of the speed signal may be only reflected in transmission of maximum-value and minimum-value of the chosen magnetic channel (e.g. speed channel or direction channel). For example, the high speed mode may be configured to send alternating frames of latest detected local minimum and local maximum. Further, the replacement of the LSB of the data payload of these alternating frames with some other relevant information (e.g. output switching or informing if the latest detected extreme value is a maximum or a minimum) may be implemented.

The bottom diagram 630 indicates data 632 (e.g. course of magnetic field in milli-Tesla [mT]) restored at the system (e.g. external receiver) based on the transmitted sensor data values.

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIG. 1-5) or below (e.g. FIG. 7-9).

Figure 7:
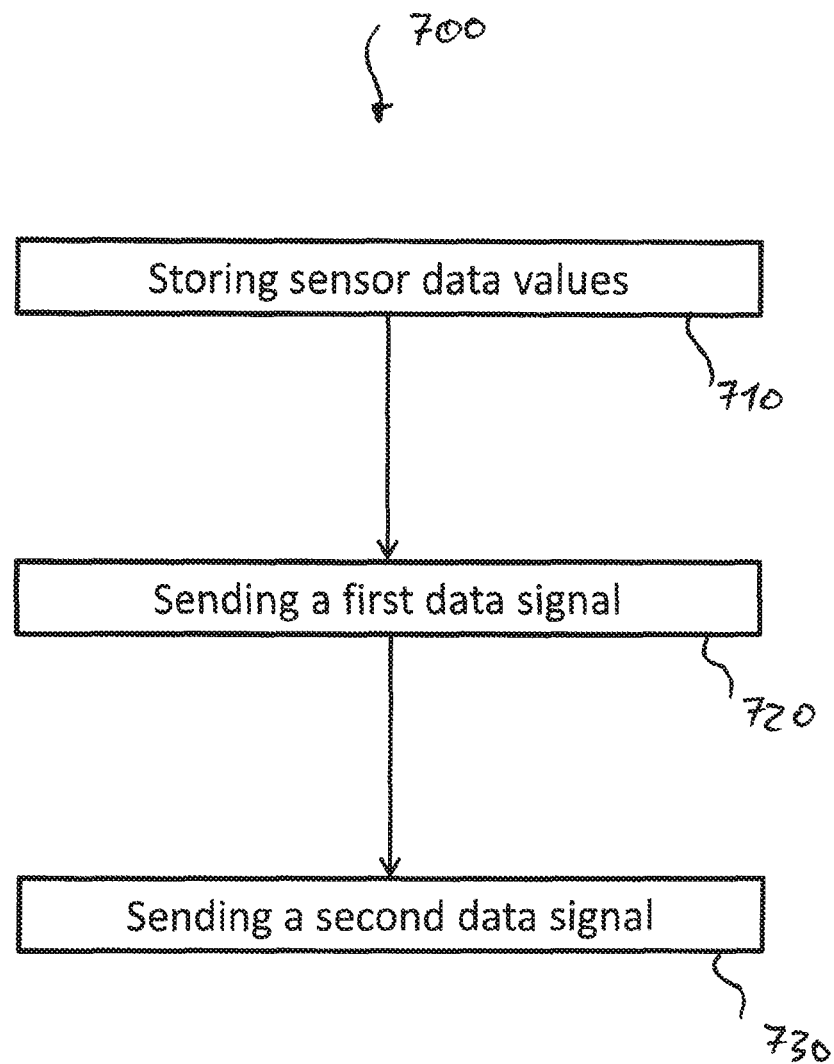
FIG. 7 shows a flow chart of a method for data transmission for a sensor device.

FIG. 7 shows a flow chart of a method for data transmission for a sensor device according to an embodiment. The method 700 comprises storing 710 sensor data values of the sensor device. Each sensor data value represents a measured value of an oscillating quantity. Further the method 700 comprises sending 720 a first data signal to an external receiver in a first state of a read-out-mode of the sensor device, if an oscillation period of the oscillating quantity is longer than a period threshold. The first data signal contains at least information on a current measured sensor data value representing a measured value of the oscillating quantity measured between a last preceding measured local maximum value of the oscillating quantity and a next succeeding local minimum value of the oscillating quantity. Further, the method 700 comprises sending 730 a second data signal to the external receiver in a second state of the read-out-mode, if the oscillation period of the oscillating quantity is shorter than the period threshold. The second data signal contains information on at least one of a first local extremum sensor data value and a succeeding second local extremum sensor data value.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6) or below (e.g. FIG. 8-9).

Figure 8:
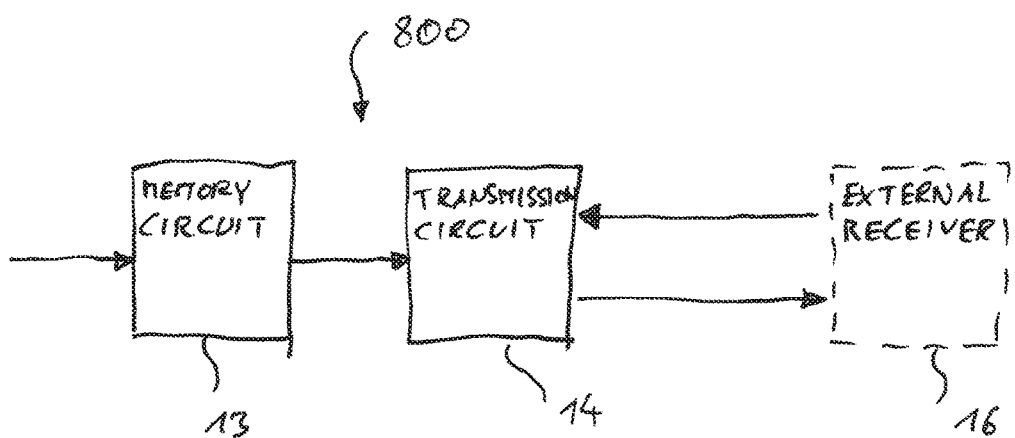
FIG. 8 shows a block diagram of a sensor device.

FIG. 8 shows a block diagram of a sensor device according to an embodiment. The sensor device comprises a memory circuit configured to store sensor data values of the sensor device. Each sensor data value represents a measured value of an oscillating quantity. Further, the sensor device comprises a transmission circuit configured to send a sensor signal in a normal operating mode of the sensor device. The sensor signal comprises a pulse for every period of the oscillating quantity. Further, the transmission circuit is configured to send a data signal in a read-out-mode of the sensor device. The data signal contains information on at least one of an offset of sensor data values of the sensor device, a temperature of the sensor device, a stored maximum sensor data value, a stored minimum sensor data value, and data stored in a read-only-memory of the sensor device.

By transmitting additional information to the external receiver, the external receiver or user may be able to monitor or control the operation of the sensor device more accurate and/or reliable.

The stored maximum sensor data value and/or the stored minimum sensor data value may correspond to extremum values of the oscillating quantity measured at a time and stored by the memory circuit, before sending the data signal. For example, the stored maximum sensor data value may be stored in a maximum register of the memory circuit and the stored minimum sensor data value may be stored in a minimum register of the memory circuit as described in connection with FIG. 5

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIG. 1-7) or below (e.g. FIG. 9).

Figure 9:
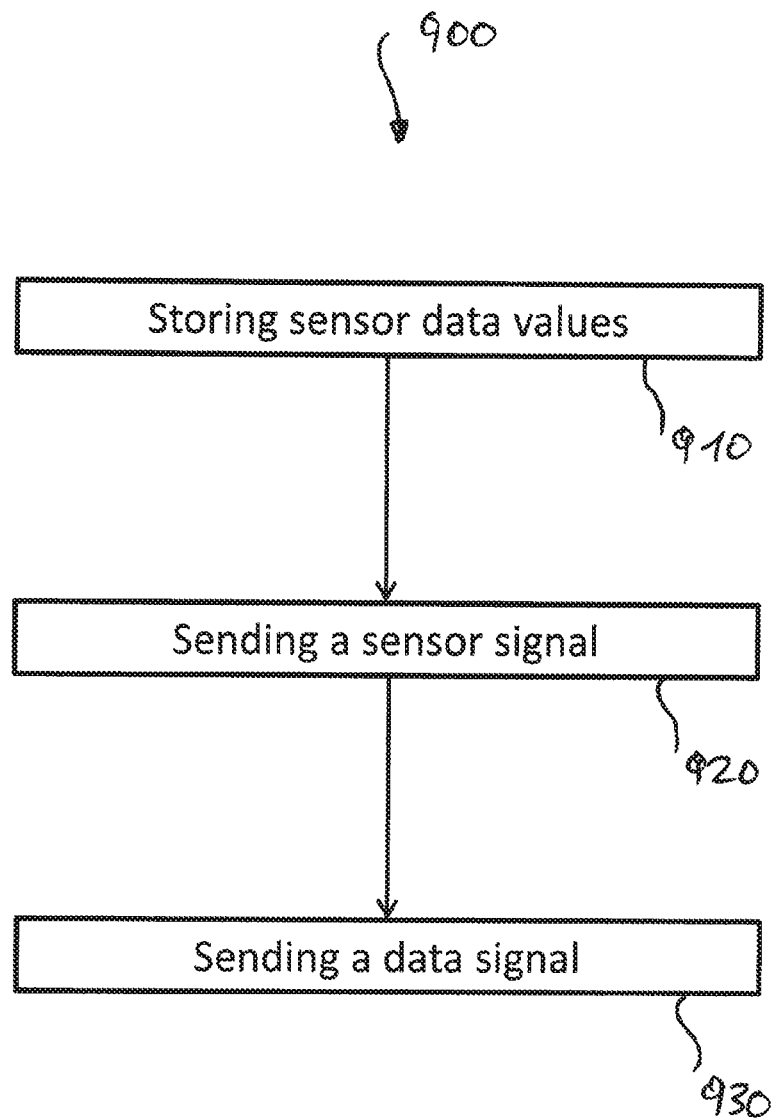
FIG. 9 shows a flow chart of a method for data transmission for a sensor device.

FIG. 9 shows a flow chart of a method for data transmission for a sensor device according to an embodiment. The method 900 comprises storing 910 sensor data values of the sensor device. Each sensor data value represents a measured value of an oscillating quantity. Further the method 900 comprises sending 920 a sensor signal in a normal operating mode of the sensor device. The sensor signal comprises a pulse for every period of the oscillating quantity. Further, the method 900 comprises sending 930 a data signal in a read-out-mode of the sensor device. The data signal contains information on at least one of an offset of sensor data values of the sensor device, a temperature of the sensor device, a stored maximum sensor data value, a stored minimum sensor data value, and data stored by a read-only-memory of the sensor device.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIG. 1-8) or below.

Some embodiments relate to an extension of a high speed interface and magnetic speed sensors showing the direction, position and speed of a trigger wheel. For diagnosis or evaluation purpose the user may be interested in internal signals of the magnetic speed sensor. These signals may be a single state (e.g. reflected in 1 bit of information), a single digital value (e.g. reflected in a value with a defined number of bits: >1) and/or a single analog value (e.g. reflected in a value with a defined number of bits: >1). For example, the sensor device may transmit these types of information to the system/to the user. For example, two registers of the speed channel indicating local minimum and local maximum may be transmitted as well.

For example, the sensor device may transmit information stored in registers at high speed indicating sensor values of a speed-channel, sensor values of a direction channel, sensor values of speed- and direction-channel alternatingly, offset-information on speed-channel, offset-information on direction-channel, actual (current) temperature information, reference temperature information, a maximum sensor value stored in a maximum-register in speed path, a minimum sensor value stored in a minimum-register in speed path, sensor values of a filtered speed-channel, sensor values of a filtered direction-channel, status information (e.g. sensor calibrated, minimum found and/or maximum found) and/or read out of actual EEPROM or laser-cut-fuses. The proposed concept may enable the transmission of any internal data to the user. For example, the essential information on magnetic tooth-height may be transmitted to the user. At idle speed normal transmission may be used but at high speed it may allow to access (increase) quality of system. For example, above a certain frequency it may transmit only the essential information (e.g. min and max) to access the system. Further, the configuration of the interface in a mode where there is a time multiplex of frames containing different register values may be enabled. For example, a voltage or current interface can be used. The used protocol may be measured using a scope, for example.

The sensor device may be a Speed-sensor sensing the position and speed of a wheel (e.g. toothed wheel or magnetic encoder). Either current modulation on Idd (e.g. 2-Pin-Sensor) or voltage-output on dedicated voltage output may be implemented.

The features disclosed in the description above, the claims below and the appended figures may be of significance and implemented either individually or in any combination for realizing an example embodiment in their various arrangements.

Although some aspects have been described in connection with an apparatus, it goes without saying that these aspects are also a description of the corresponding method, which means that a block or a component of an apparatus is also intended to be understood as a corresponding method step or as a feature of a method step. Similarly, aspects that have been described in connection with a or as a method step are also a description of a corresponding block or detail or feature of a corresponding apparatus.

Depending on particular implementation requirements, example embodiments of the disclosure may be implemented in hardware or in software. The implementation can be performed using a digital storage medium, for example a floppy disk, a DVD, a Blu-Ray disk, a CD, a ROM, a PROM, an EPROM, an EEPROM or a FLASH memory, a hard disk or another magnetic or optical memory that store electronically readable control signals that can or do interact with a programmable hardware component such that the respective method is performed.

A programmable hardware component may be formed by a processor, a computer processor (CPU=central processing unit), a graphics processor (GPU=graphics processing unit), a computer, a computer system, an application-specific integrated circuit (ASIC), an integrated circuit (IC), a system on chip (SOC), a programmable logic element or a field programmable gate array (FPGA) with a microprocessor.

The digital storage medium may therefore be machine or computer readable. Some example embodiments thus comprise a data storage medium that has electronically readable control signals that are capable of interacting with a programmable computer system or a programmable hardware component such that one of the methods described herein is performed. An example embodiment is therefore a data storage medium (or a digital storage medium or a computer readable medium) on which the program for performing one of the methods described herein is recorded.

In general, example embodiments of the present disclosure may be implemented as a program, firmware, computer program or computer program product with a program code or as data, wherein the program code or the data is or are active to the effect of performing one of the methods when the program runs on a processor or a programmable hardware component. The program code or the data may also be stored on a machine readable medium or data storage medium, for example. The program code or the data may be in the form of source code, machine code or byte code and as other intermediate code, inter alia.

A further example embodiment is additionally a datastream, a signal train or a sequence of signals that represent(s) the program for performing one of the methods described herein. The datastream, the signal train or the sequence of signals may be configured, by way of example, to be transferred via a data communication link, for example via the Internet or another network. Example embodiments are thus also data-representing signal trains that are suitable for being sent via a network or a data communication link, wherein the data are the program.

A program according to one example embodiment can implement one of the methods while it is being performed, for example by virtue of it reading memory locations or writing a datum or a plurality of data thereto, which possibly brings about switching processes or other processes in transistor structures, in amplifier structures or in other electrical, optical or magnetic subassemblies, or subassemblies operating on the basis of another functional principle. Accordingly, reading a memory location allows data, values, sensor values or other information to be sensed, determined or measured by a program. By reading one or more memory locations, a program is therefore able to sense, determine or measure variables, values, measured variables and other information, and writing to one or more memory locations allows it to bring about, prompt or perform an action and to actuate other devices, machines and components.

The example embodiments described above are merely an illustration of the principles of the present disclosure. It goes without saying that modifications and variations of the arrangements and details described herein will be apparent to other persons skilled in the art. The intension is therefore that the disclosure be limited merely by the scope of protection of the patent claims that follow rather than by the specific details that have been presented herein on the basis of the description and the explanation of the example embodiments.

The invention claimed is:

1. A sensor device comprising:
    a memory circuit configured to store sensor data values of the sensor device, wherein each sensor data value represents a measured value of an oscillating quantity; and
    a transmission circuit configured to send a first data signal to an external receiver in a first state of a read-out-mode of the sensor device, if an oscillation period of the oscillating quantity is longer than a period threshold, wherein the first data signal contains at least information on a current sensor data value representing a measured value of the oscillating quantity measured between a last preceding measured local maximum value of the oscillating quantity and a next succeeding local minimum value of the oscillating quantity,
    wherein the transmission circuit is configured to send a second data signal to the external receiver in a second state of the read-out-mode, if the oscillation period of the oscillating quantity is shorter than the period threshold, wherein the second data signal contains information on at least one of a first local extremum sensor data value and a succeeding second local extremum sensor data value.

2. The sensor device as claimed in claim 1, wherein the first local extremum sensor data value corresponds to a latest measured local maximum value of the oscillating quantity and the second local extremum sensor data value corresponds to a latest measured local minimum value of the oscillating quantity.

3. The sensor device as claimed in claim 2, wherein the memory circuit comprises a measurement register configured to store the current sensor data value, wherein the memory circuit comprises a maximum register configured to store the latest local maximum sensor data value, wherein the memory circuit comprises a minimum register configured to store the latest local minimum sensor data value.

4. The sensor device as claimed in claim 1, wherein the transmission circuit is configured to receive a sensor-data-value-read-command from the external receiver, wherein the transmission circuit is configured to start transmitting at least one of the first data signal and the second data signal in response to the reception of the sensor-data-value-read-command.

5. The sensor device as claimed in claim 1, wherein the transmission circuit is configured to receive a fast-read-out-command from the external receiver, wherein the transmission circuit is configured to start transmitting at least one of the first data signal and the second data signal after reception of the fast-read-out-command.

6. The sensor device as claimed in claim 1, wherein the transmission circuit is configured to receive trigger pulses from the external receiver in the read-out-mode, wherein the transmission circuit is configured to send information stored in at least one requested register after a trigger pulse.

7. The sensor device as claimed in claim 6, wherein the requested register of the memory circuit is identified by address information received from the external receiver.

8. The sensor device as claimed in claim 6, wherein the information stored in the requested register is information on at least one of the current sensor data value, the latest local maximum sensor data value, the latest local minimum sensor data value, an offset of the sensor data values, a current temperature, a reference temperature, a status of the sensor device, and data stored in a read-only-memory of the sensor device.

9. The sensor device as claimed in claim 6, wherein the period threshold is lower than 10 times a time between directly succeeding trigger pulses received in the first state of the read-out-mode.

10. The sensor device as claimed in claim 6, wherein the period threshold is larger than 2 times a time between directly succeeding trigger pulses received in the first state of the read-out-mode.

11. The sensor device as claimed in claim 6, wherein in response to a first trigger pulse received from the external receiver in the second state of the read-out-mode, the transmission circuit is configured to send the first local extremum sensor data value corresponding to a most recent measured local extremum value of the oscillating quantity, wherein in response to a second trigger pulse received from the external receiver in the second state of the read-out-mode, the transmission circuit is configured to retransmit the first local extremum sensor data value provided no newer local extremum value of the oscillating quantity was measured since the first trigger pulse.

12. The sensor device as claimed in claim 1, wherein the second data signal contains information on at least one of the first local extremum sensor data value and the succeeding second local extremum sensor data value without containing information on any other sensor data value corresponding to a measured value of the oscillating quantity measured between the first local extremum sensor data value and the second local extremum sensor data value.

13. The sensor device as claimed in claim 1, further comprising a control circuit configured to determine a current oscillation period of the oscillating quantity, wherein the control circuit is configured to switch the sensor device from the first state of the read-out-mode to the second state of the read-out-mode, if the current oscillation period falls below the period threshold.

14. The sensor device as claimed in claim 1, wherein the oscillating quantity is a magnetic field caused by a rotating element, wherein the sensor device comprises a magnetic field sensor configured to generate the measured values of the oscillating quantity by measuring the magnetic field.

15. The sensor device as claimed in claim 1, wherein the transmission circuit is configured to send a sensor signal in a normal-operating-mode of the sensor device, wherein the sensor signal comprises a pulse for every period of the oscillating quantity.

16. The sensor device as claimed in claim 1, wherein the transmission circuit is configured to transmit in the second state of the read-out-mode solely extreme values of the oscillating quantity.

17. The sensor device as claimed in claim 1, wherein a number of sensor data values transmitted per unit time in the first state of the read-out-mode is equal to a number of sensor data values transmitted per unit time in the second state of the read-out-mode.

18. The sensor device as claimed in claim 1, wherein the transmission unit is configured to send the first data signal and the second data signal by modulating a supply current provided to the sensor device.

19. A sensor device comprising:
  a memory circuit configured to store sensor data values of the sensor device, wherein each sensor data value represents a measured value of an oscillating quantity; and
  a transmission circuit configured to send a sensor signal to an external receiver in a normal operating mode of the sensor device, wherein the sensor signal comprises a pulse for every period of the oscillating quantity,
  wherein the transmission circuit is configured to send a data signal to the external receiver in a read-out-mode of the sensor device, wherein the data signal contains information on at least one of an offset of sensor data values of the sensor device, a temperature of the sensor device, a stored maximum sensor data value, a stored minimum sensor data value, and data stored by a read-only-memory of the sensor device.

20. A method for data transmission for a sensor device, the method comprising:
  storing sensor data values of the sensor device, wherein each sensor data value represents a measured value of an oscillating quantity;
  sending a first data signal to an external receiver in a first state of a read-out-mode of the sensor device, if an oscillation period of the oscillating quantity is longer than a period threshold, wherein the first data signal contains at least information on a current sensor data value representing a measured value of the oscillating quantity measured between a last preceding measured local maximum value of the oscillating quantity and a next succeeding local minimum value of the oscillating quantity; and
  sending a second data signal to the external receiver in a second state of the read-out-mode, if the oscillation period of the oscillating quantity is shorter than the period threshold, wherein the second data signal contains information on at least one of a first local extremum sensor data value and a succeeding second local extremum sensor data value.

* * * * *